(12) United States Patent
Haque et al.

(10) Patent No.: US 8,542,143 B1
(45) Date of Patent: Sep. 24, 2013

(54) PIPELINED ADC STAGE FILTERS

(75) Inventors: Yusuf Haque, Woodside, CA (US);
Ryan James Kier, Salt Lake City, UT (US); Rex K. Hales, Riverton, UT (US); Paul Talmage Watkins, Midvale, UT (US); Marcellus C. Harper, Kaysville, UT (US)

(73) Assignee: Crest Semiconductors, Inc., San Jose, CA (US)

( * ) Notice: Subject to any disclaimer, the term of this patent is extended or adjusted under 35 U.S.C. 154(b) by 0 days.

(21) Appl. No.: 13/413,430

(22) Filed: Mar. 6, 2012

(51) Int. Cl.
*H03M 1/34* (2006.01)
(52) U.S. Cl.
USPC ............................ 341/161; 341/155; 341/156
(58) Field of Classification Search
USPC ......................... 341/161, 155, 156
See application file for complete search history.

(56) References Cited

U.S. PATENT DOCUMENTS

| 6,072,355 | A | * | 6/2000 | Bledsoe | 327/390 |
|---|---|---|---|---|---|
| 6,396,429 | B2 | | 5/2002 | Singer et al. | |
| 6,596,429 | B2 | | 7/2003 | Shimanuki et al. | |
| 6,822,601 | B1 | * | 11/2004 | Liu et al. | 341/161 |
| 7,319,425 | B2 | * | 1/2008 | Fiorenza et al. | 341/172 |

* cited by examiner

*Primary Examiner* — Jean B Jeanglaude
(74) *Attorney, Agent, or Firm* — Steven L. Nichols; Van Cott, Bagley, Cornwall & McCarthy P.C.

(57) ABSTRACT

A pipelined Analog-to-Digital Converter (ADC) stage includes a main sampling path having a first filter in series with a first sample and hold circuit and a sub-ADC sampling path having a second filter in series with a second sample and hold circuit driving a sub-ADC connected to a sub-Digital-to-Analog Converter (DAC). The frequency response of the main sampling path is matched to a frequency response of the sub-ADC sampling path such that a residue signal of the pipelined ADC stage stays within range.

20 Claims, 8 Drawing Sheets

Sample an input signal with a main sampling path comprising a first snubbing filter and a sub-DAC
(block 702)

Sample the input signal with a sub-ADC sampling path comprising a second filter and a sub-ADC connected to the sub-DAC, wherein a frequency response of the main sampling path is matched to a frequency response of the sub-ADC sampling path such that a residue signal of the pipelined ADC stage stays within range
(block 704)

*Fig. 7*

PIPELINED ADC STAGE FILTERS

BACKGROUND

Electronic devices typically make use of both analog and digital signals. An analog signal is a continuous signal which may assume any value. A digital signal is one which assumes one of a discrete set of values. A signal may be in the form of an electrical current or a voltage. Electronic circuitry often includes devices for transferring analog signals into digital signals and vice versa. For example, an Analog-to-Digital Converter (ADC) transfers analog signals into digital signals while a Digital-to-Analog Converter (DAC) transfers digital signals into analog signals.

One type of ADC is a pipelined ADC. A pipelined ADC uses a series of stages, each stage determining a sub-set of bits from the final digitized value. For example, a pipelined ADC may convert an analog signal into a sixteen-bit digital signal. The pipelined ADC may include four stages, each stage extracting four bits to add to the total digital word. The earlier stages extract the most significant bits while the later stages convert the least significant bits.

Each stage includes a sub-ADC to convert the appropriate number of bits from that stage. A sub-DAC is then used to create an analog version of the newly converted digital signal. This analog version of the newly converted digital signal is then subtracted from the original signal. The remaining signal, which is referred to as the residue signal, is then sent to subsequent stages for further processing.

BRIEF DESCRIPTION OF THE DRAWINGS

The accompanying drawings illustrate various examples of the principles described herein and are a part of the specification. The drawings are merely examples and do not limit the scope of the claims.

Throughout the drawings, identical reference numbers designate similar, but not necessarily identical, elements.

DETAILED DESCRIPTION

As mentioned above, each stage of a pipelined ADC includes a sub-ADC to convert the appropriate number of bits from that stage. A sub-DAC is then used to create an analog version of the newly converted digital signal. This analog version of the newly converted digital signal is then subtracted from the original signal. The remaining signal, which is referred to as the residue signal, is then sent to subsequent stages for further processing.

Specifically, the input signal is split along a main sampling path and a sub-ADC sampling path. The main sampling path samples the input signal and uses the sub-DAC to subtract a quantized version of the input signal from the sampled input signal to create the residue signal. The sub-ADC sampling path samples the input signal and creates a quantized version of that signal to be subtracted from the input signal sampled by the main sampling path. The switches used within the circuitry that performs the sample-and-hold function creates a charge injection. The charge injection results from the opening and closing of those switches. These charge injections create spurious spikes in the input signal which create non-linearity and thus increase distortion for the pipelined ADC stage.

In light of this issue, the present specification discloses use of filters attached to both the main sampling path and the sub-ADC sampling path. The filters allow lower frequency signals from the input to pass while blocking spurious higher frequency signals kicked back from the internal stage. Because the spurious spikes resulting from the charge injection are essentially high frequency signals, the filters are designed to snub out these higher frequency momentary kickbacks. A low pass filter, where lower frequencies are unaffected but higher frequencies are attenuated is one example of such a filter. The filter used in the main signal path can be different from the filter used in the sub-ADC path. Each filter can be designed to optimize the performance of each stage. Since the size of the kickbacks is in each path is likely to be different, this flexibility allows for better optimization.

Additionally the frequency response for the combination of the snubbing filter for the main sampling path and the sample and hold circuit of the main sampling path can be matched to the combination of the filter in the sub-ADC path and the sub-ADC sample and hold circuit. Matching refers to the matching of the frequency response of the paths. The frequency response of the sampling paths refers to how the output signal level is affected by frequency of the input signal. The resistance of the switch and the capacitor used to store the sampled signal form a low pass filter. A low pass filter causes the signal level to attenuate at higher frequencies. Thus, at higher frequencies, it is important that the frequency response of both signaling paths is matched so that one signal is not too attenuated in comparison to the other. The sampling paths should be matched to the degree that the residue signal stays within range of the stage and thus does not introduce an uncorrectable error into the pipelined ADC.

By matching the combination of the paths with the filters, the sub-ADC may be mismatched with the main sampling path while having the overall paths remain matched. This allows for more freedom in the design of the sub-ADC. Specifically, performance can be increased in some cases by introducing characteristics into the sub-ADC that result in a frequency response mismatch between the sub-ADC and the main sampling path.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an example" or similar language means that a particular feature, structure, or characteristic described in connection with that example is included as described, but may not be included in other examples.

Figure 1:
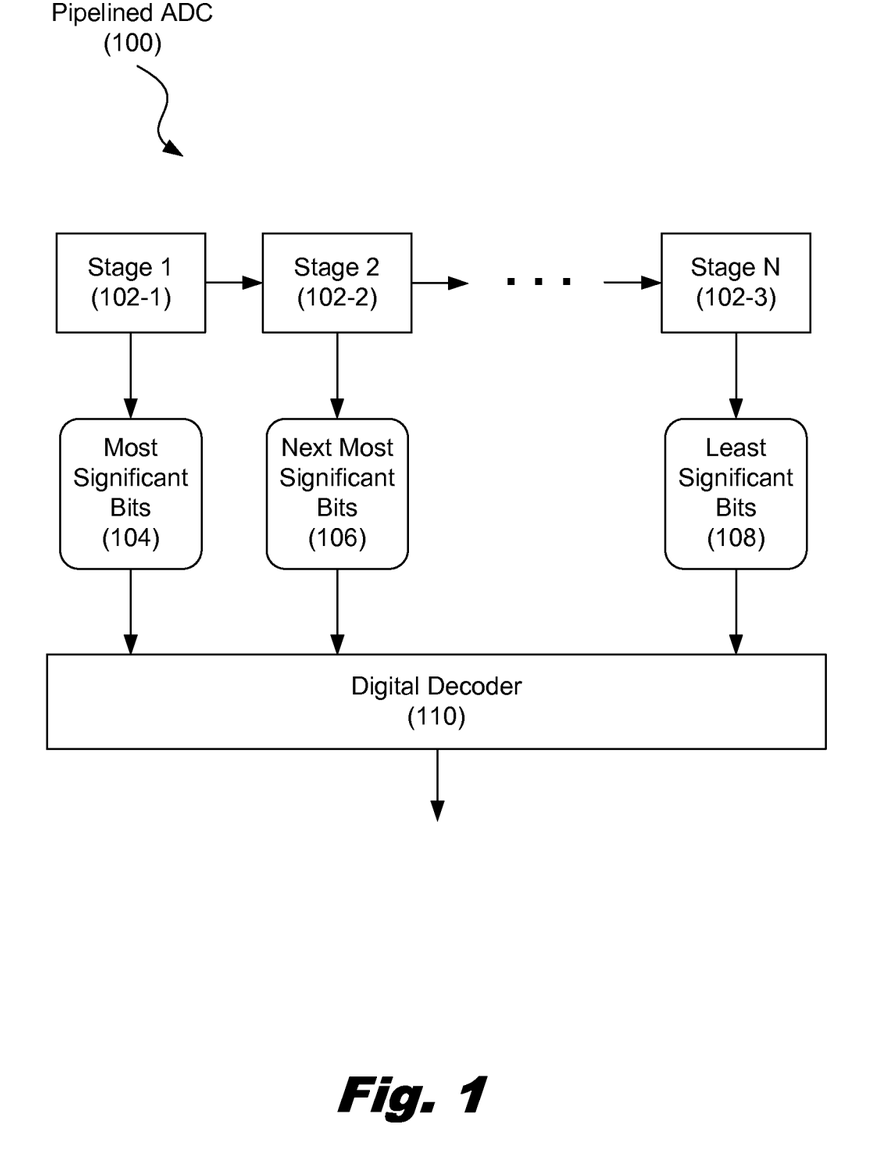
FIG. 1 is a diagram showing an illustrative pipelined ADC, according to one example of principles described herein.

Referring now to the figures, FIG. 1 is a diagram showing an illustrative pipelined ADC (100). As mentioned above, a pipelined ADC (100) includes a number of stages (102). Each stage is responsible for converting a subset of bits for the entire word length of bits used by the pipelined ADC (100). The first stage (102-1) of the pipelined ADC typically converts the most significant bits (104). The second stage (102-2) of the pipelined ADC (100) then converts the next most significant bits (106). This continues until the last stage (102-3) of the pipelined ADC (100) converts the least significant bits (108). At each stage, the converter bits are put into a digital decoder (110) that uses the entire word length of bits for processing. The output of the digital decoder is thus a digital signal.

Figure 2:
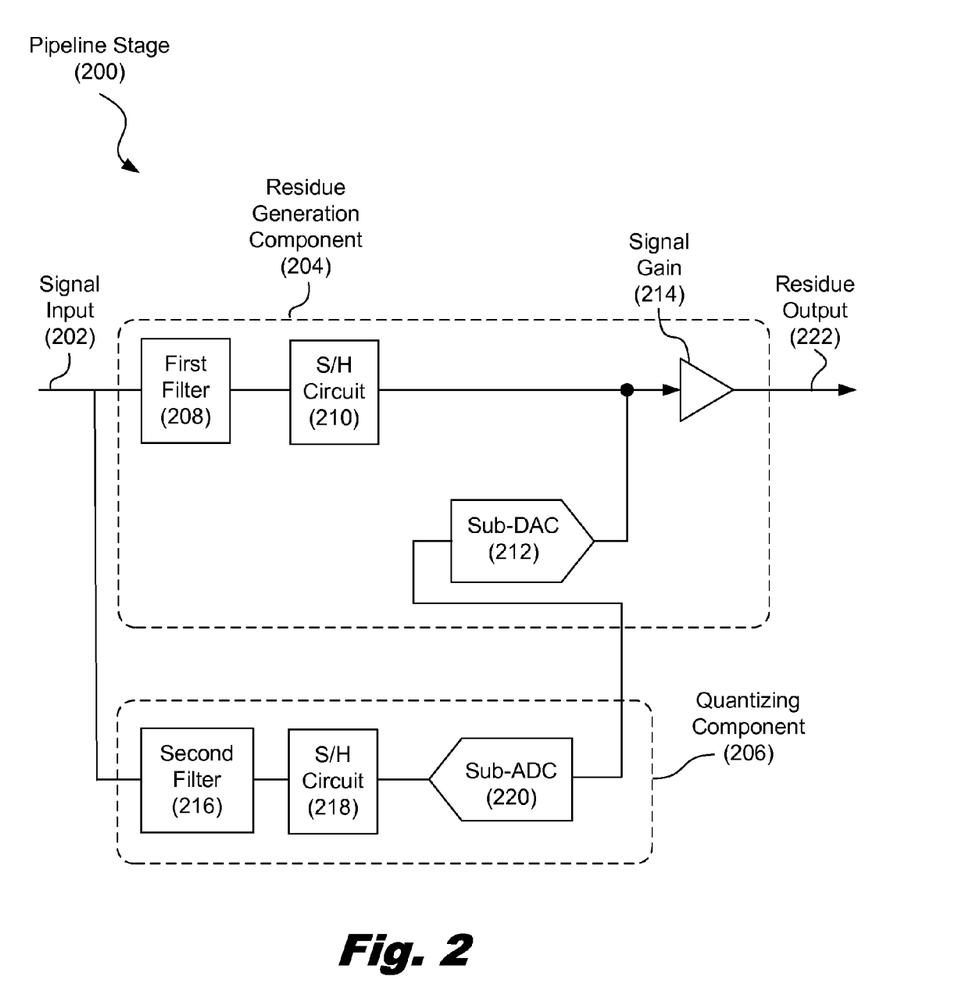
FIG. 2 is a diagram showing an illustrative pipelined ADC stage, according to one example of principles described herein.

FIG. 2 is a diagram showing an illustrative pipelined ADC stage (200). The diagram may represent either a single ended or differential pipeline stage (200). A differential ADC measures the value between two input signals rather than the value of a single input signal with respect to ground.

According to certain illustrative examples, the pipelined ADC stage comprises a signal input that is connected to two main components. The first component is the residue generation component (204). This component corresponds to the main sampling path. The second component is the quantizing component (206). This component corresponds to the sub-ADC sampling path.

The residue generation component (204) comprises a first snubbing filter (208), a sample-and-hold circuit (210), and a sub-DAC (212). The first filter (208) is positioned between the signal input (202) and the sample-and-hold circuit. The sub-DAC (212) is connected to a node between the sample-and-hold circuit (210) and the residue output (222). In some cases, a signal gain component (214) may be placed between the node and the residue output (222). The combination of the sample-and-hold circuit (210) and the sub-DAC form a Multiplying Digital-to-Analog Converter (MDAC).

The quantizing component (206) includes a second snubbing filter (216), a sample-and-hold circuit (218), and a sub-ADC (220). The second filter (216) is connected between the signal input (202) and the sample-and-hold circuit (218). The sample-and-hold circuit (218) is connected to the input of a sub-ADC (220). The output of the sub-ADC (220) is connected to the sub-DAC (212) of the residue generation component (204). The following will describe the operation of the pipeline ADC stage.

As an input signal is received by the pipeline stage (200), it is sampled by both the sample-and-hold circuit (210) from the main sampling path and the sample-and-hold circuit (218) of the sub-ADC sampling path. A sample-and-hold circuit (228) alternates between a sample mode and a hold mode. While in sample mode, the output of the sample-and-hold circuit (228) mode tracks the input of the sample-and-hold circuit (228). While in hold mode, the output maintains the value of the input signal at the moment in which the circuit (228) was switched to hold mode. The hold mode is just long enough to allow processing of that signal by the other pipelined ADC stage (200) components.

The sample-and-hold circuit (218) of the sub-ADC path feeds the sampled input signal to the sub-ADC (220). The sub-ADC (220) may be a simple low resolution ADC designed to convert the received input signal (202) into a small number of bits. For example, the ADC may have only a three or four bit resolution. In some cases, the sub-ADC (220) may be a flash ADC. Flash ADCs are able to operate at faster rates. However, they require the use of several comparator circuits. The output of the sub-ADC (220) is a quantized version of the sampled input signal. This quantized signal is fed to the digital decoder (e.g. 110, FIG. 1) and into the sub-DAC (212) of the residue generation component (204).

In some cases, the sample-and-hold circuit (218) is not a discrete circuit. Rather, components within the sub-ADC (220) perform the sample-and-hold functions. For example, the capacitors within the sub-ADC (220) may be used to store a voltage signal during the sample phase and maintain that value throughout the hold phase.

As mentioned above, the sampling process, whether performed by a discrete sample-and-hold circuit or a sample-and-hold circuit integrated with the sub-ADC (220), involves the opening and closing of sampling switches. This opening and closing can introduce spurious spikes in the sampled input signal. To counter this effect, the second filter (216) can be designed to snub out these signal spikes while allowing the input signal to pass relatively unaffected.

As mentioned above, the input signal is also fed into the residue generation component (204). In this component, the input signal is sampled by the sample-and-hold circuit (210). The output of the sample-and-hold circuit (210) is connected to a node that is also connected to the sub-DAC (212). The sub-DAC (212) may also be a low resolution device capable of handling the output of the sub-ADC. For example, the sub-DAC (212) may have a digital input of three or four bits. The sub-DAC (212) then produces an analog version of the quantized signal received from the sub-ADC (220). This analog signal will be slightly different than the input signal due to the lower resolution of the sub-ADC (220) and sub-DAC (212). This analog output of the sub-DAC (212) is then subtracted from the original sampled input signal. The difference between the original sampled input signal and the output of the sub-DAC (212) is referred to as the residue signal (224). This residue signal may be amplified by a signal gain component (214).

Like the sample-and-hold circuit (218) from the quantizing component, the sample-and-hold circuit (210) from the main sampling path introduces spurious signal spikes as a result of the opening and closing of switches. Thus, a filter (208) is used to snub out these spurious signals. As will be described in further detail below, having separate filters for each path, greater freedom can be used in the design of the components while still providing frequency response matching between the main sampling path and the sub-ADC sampling path.

Figure 3:
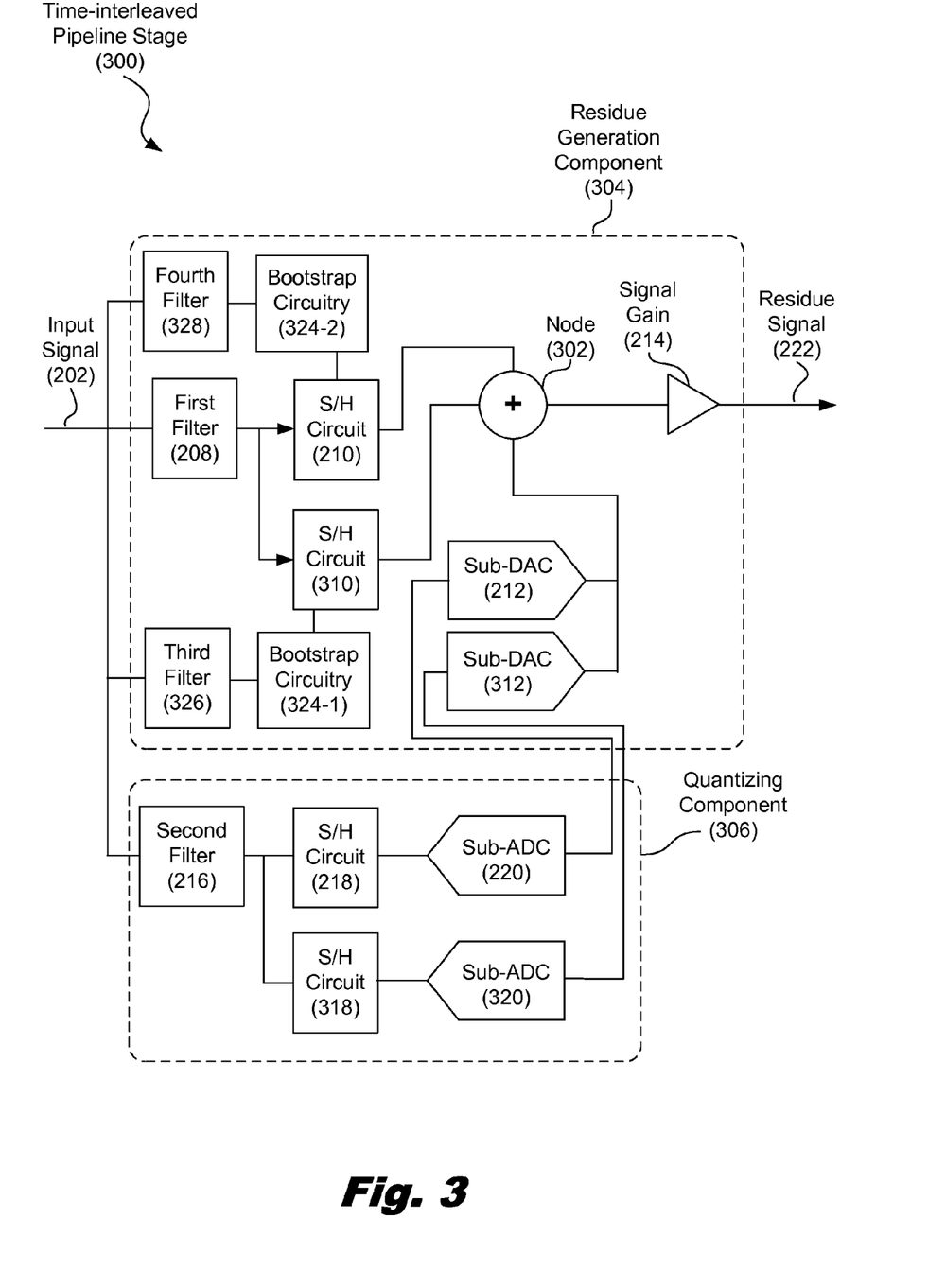
FIG. 3 is a diagram showing an illustrative time-interleaved pipelined ADC stage, according to one example of principles described herein.

FIG. 3 is a diagram showing an illustrative time-interleaved pipelined ADC stage. According to certain illustrative examples, a time-interleaved pipelined ADC stage includes multiple sub-ADC circuits in the quantizing component, each sub-ADC with its own sample-and-hold circuit. Additionally, the time-interleaved pipelined ADC stage includes multiple sample-and-hold circuits in the main sampling path. These multiple components are time multiplexed so that they each of the sub-ADC circuits process the input signal at different times. The digital output of each of these parallel sub-ADC circuits is then recombined accordingly to produce a final digital signal.

FIG. 3 illustrates a two prong time-interleaved ADC pipelined stage (300). This means that the pipelined ADC switches between two sampling prongs. According to certain illustrative examples, the quantizing component (306) alternates the sampling of the input signal between a first sample-and-hold circuit (218) and a second sample-and-hold circuit (318). The first sample-and-hold circuit (218) is connected to a first sub-ADC (220) while the second sample-and-hold circuit (318) is connected to a second sub-ADC (320). Both sub-ADCs (220, 320) are connected to corresponding sub-DACs During a first time interval, the input signal is sampled by the main sample-and-hold circuit (210) in the residue generation component (304). During this time interval, the sub-DAC (212) subtracts a quantized signal as sampled and processed by the first sample-and-hold circuit (218) and sub-ADC (220) of the quantizing component (206). During a second time interval, the input signal is sampled by a second sample-and-hold circuit (310) in the residue generation component (304). During this time interval, the sub-DAC (212) subtracts a quantized signal as sampled and processed by the second sample-and-hold circuit (318) and sub-ADC (320) of the quantizing component (306).

While the different prongs of the time-interleaved sub-ADC may alternate sampling of the input signal, they may share the first filter of the residue generation component (304) and the second filter (216) of the quantization component (306). These filters (208, 216) will thus be used to snub out spurious signals from each of the sample-and-hold circuits (210, 310, 218, 318). Although FIG. 3 illustrates an example in which sample-and-hold circuits share filters, it may be the case that each sample-and-hold circuit is associated with a unique filter.

In some cases, the sample-and-hold circuits may utilize bootstrap circuitry (224). Bootstrap circuitry (224) is used to control the switching circuitry within the sample-and-hold circuit and to help maintain the linearity of the sample-and-hold circuit. A more detailed explanation of a bootstrap mechanism may be found, for example, in D. Askin et al., *Switch Bootstrapping for Precise Sampling Beyond Supply Voltage*, IEEE Journal of Solid State Circuits, Vol. 41, Issue 8, 1938-1943 (2006).

In the example of FIG. 3, the bootstrap circuitry (324-1, 324-2) is shown connected to the sample and hold circuits (210, 310) within the residue generation component (304). Additionally, the sample and hold circuits (218, 318) within the quantizing component (306) may utilize bootstrap circuits or may share the bootstrap circuitry (324) within the residue generation component (304) for each of the sample and hold circuits with the correct phase relationship.

The bootstrap circuitry uses the input signal (202) to help control the sampling switches of the sample and hold circuits. Because the bootstrap circuitry may also introduce spurious signal spikes into the input signal, a filter (226) can be placed between the signal input and the bootstrap circuitry to snub out such signals. As will be described in more detail below, the bootstrap path may also be matched to both the sub-ADC sampling path and the main sampling path.

Figure 4A:
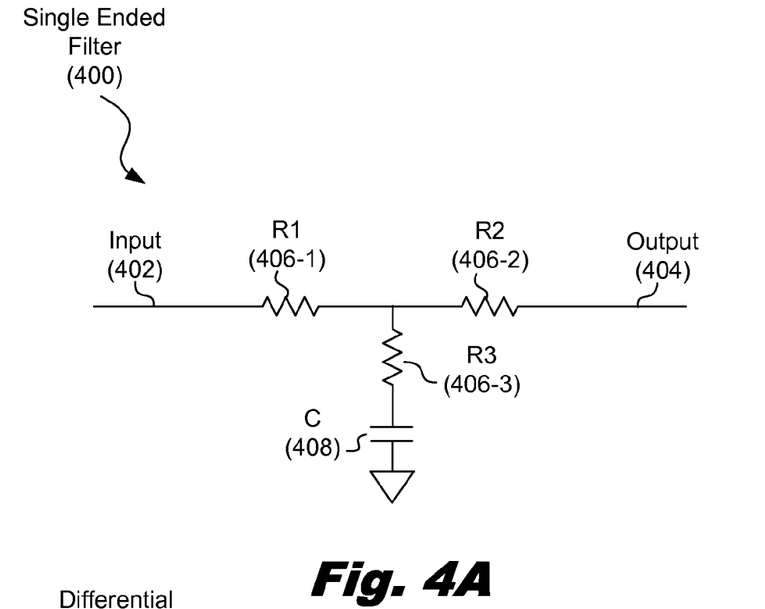
FIGS. 4A-4C are diagrams showing illustrative filters, according to one example of principles described herein.
Figure 4B:
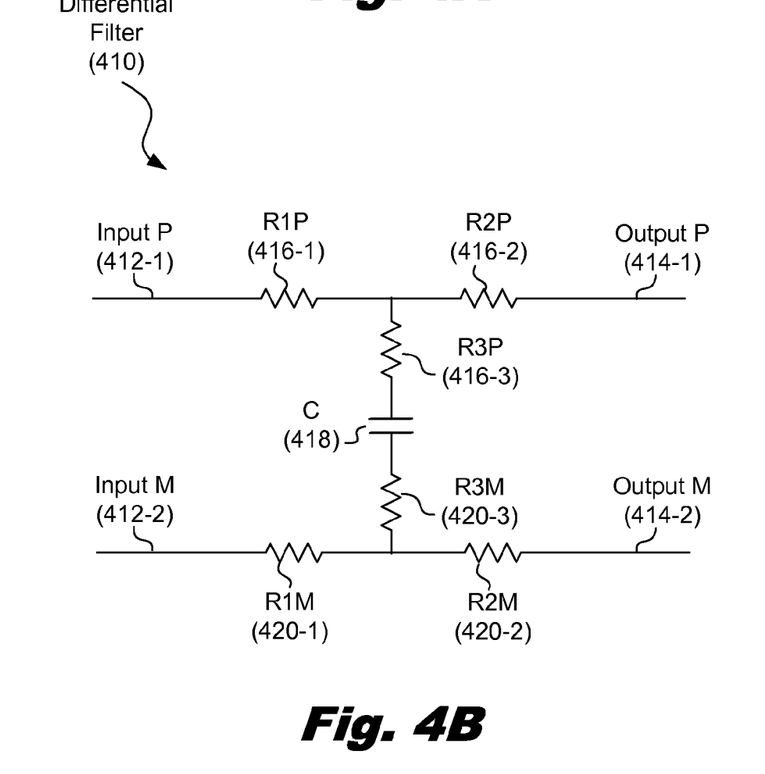
Figure 4C:
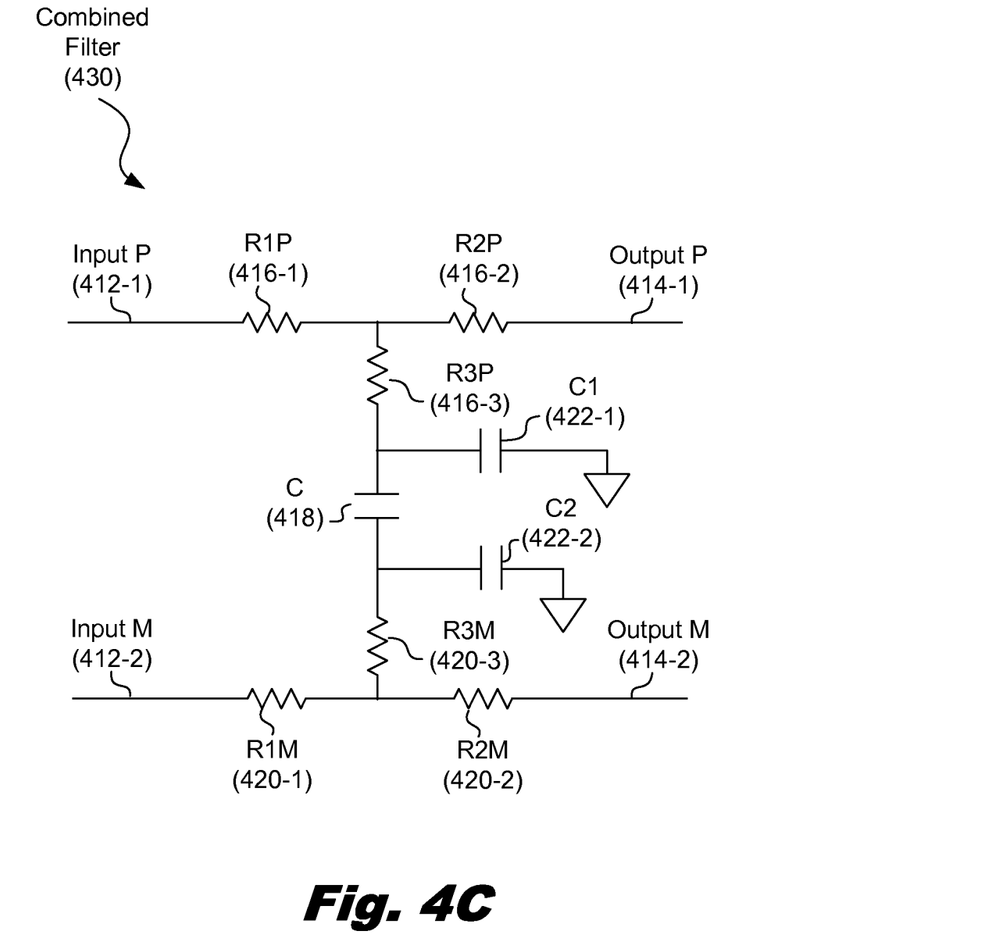

FIGS. 4A-4C are diagrams showing illustrative filters. FIG. 4A is a diagram showing an illustrative single ended filter (400). A single ended filter is one for use in a single ended pipelined ADC as well as to a differential pipelined ADC. A single ended ADC measures the value of an analog signal with respect to ground. According to certain examples, the filter (400) includes a set of resistors (406) and a capacitor (408) placed between an input (402) and an output (404).

The resistors (406) in combination with the capacitor (408) form a low pass filter. The resistance values and capacitance values are selected such that the filter only removes the high frequency signal spikes caused by the charge injection from the opening and closing of sampling switches without substantially affecting the input signal. A differential pipelined ADC may also use such single-ended filters. In such cases, a filter is placed between the positive signal and ground as well as between the negative signal and ground.

FIG. 4B is a diagram showing an illustrative differential filter (410). A differential filter (410) is one for use with a differential pipelined ADC. A differential pipelined ADC is one that measures the difference between two analog signals. According to certain illustrative examples, there are two inputs (412) and two outputs (414). Specifically, there is a positive signal input (412-1) and a negative signal input (412-2). Likewise, there is a positive signal output (414-1) and a negative signal output (414-2). The capacitor (418) is connected between the two signal paths. The resistance values (416) within the positive signal path and the resistance values (420) in the negative signal path are such that high frequency signal spikes are removed while the input signal is not substantially affected.

FIG. 4C is a diagram showing an illustrative filter combined differential and single ended use. According to certain illustrative examples, additional capacitors C1 (422-1) and C2 (422-2) are connected to ground. Such a hybrid filter with both differential and single-ended components will snub both common mode and differential components of a signal.

Figure 5A:
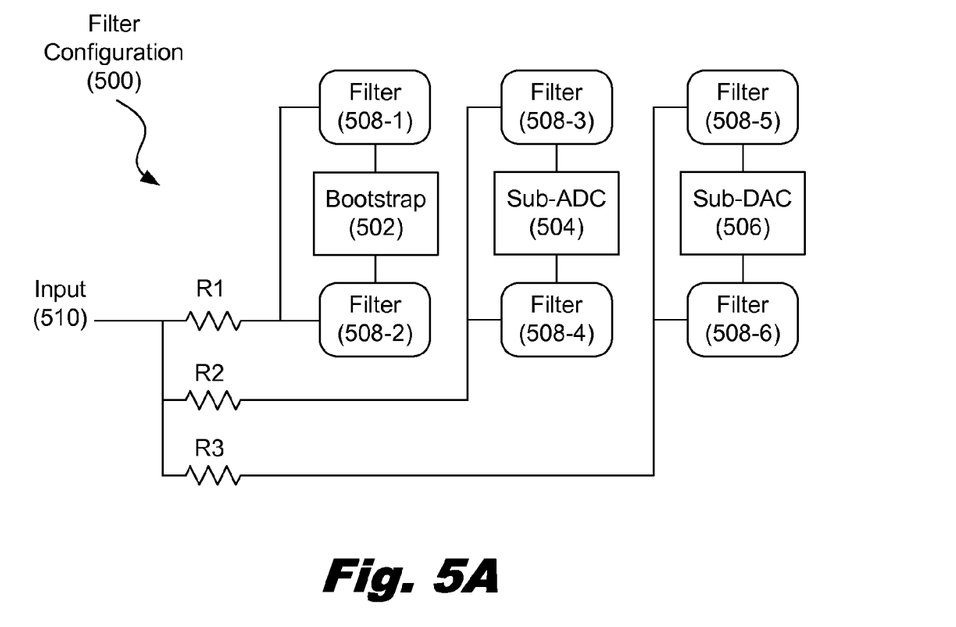
FIGS. 5A and 5B are diagrams showing illustrative filter configurations, according to one example of principles described herein.
Figure 5B:
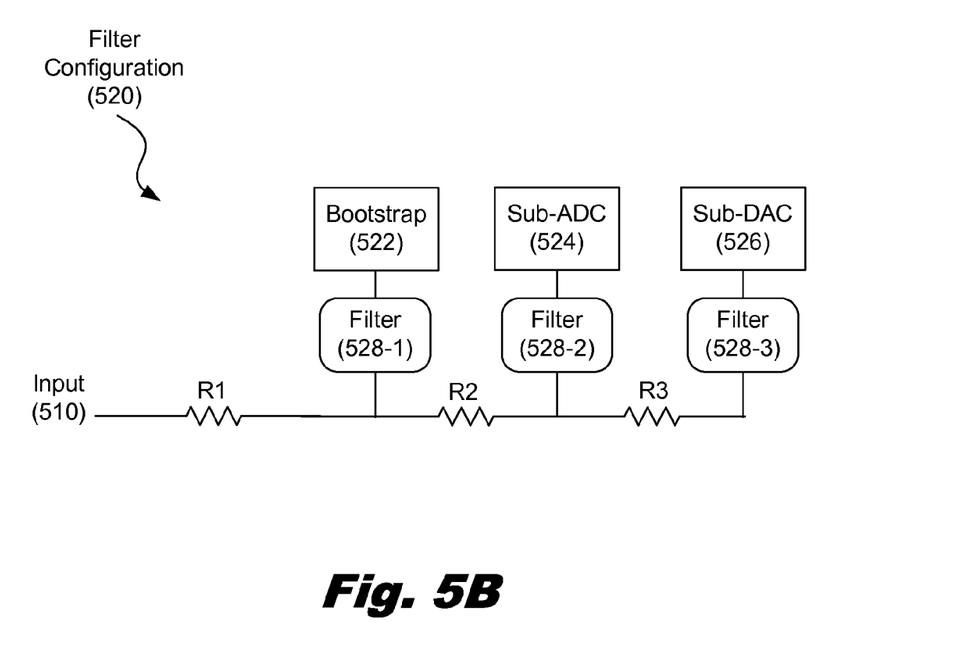

FIGS. 5A and 5B are diagrams showing illustrative filter configurations. FIG. 5A shows a filter configuration (500) for one side of a differential pipelined ADC. The other side of the differential pipelined ADC may be of similar structure. According to certain illustrative examples, the input signal is split is fed into the bootstrap path (502), the sub-ADC path (504), and the sub-DAC path. Each path includes filters (508) both above and below the sampling circuitry of each path to snub out spurious signals where those signals are generated. The resistors R1, R2, and R3 as well as the filters (508) are such that each path has a matched frequency response.

FIG. 5B is a diagram showing an illustrative filter wiring configuration (520) in which the resistors R1, R2, and R3 are in series. These resistors as well as the filters (528) connected to the different sampling paths are designed such that each sampling path has a matched frequency response. Thus, the bootstrap path (522), the sub-ADC sampling path (524) and the sub-DAC path (526) have a substantially matched frequency response.

Figure 6:
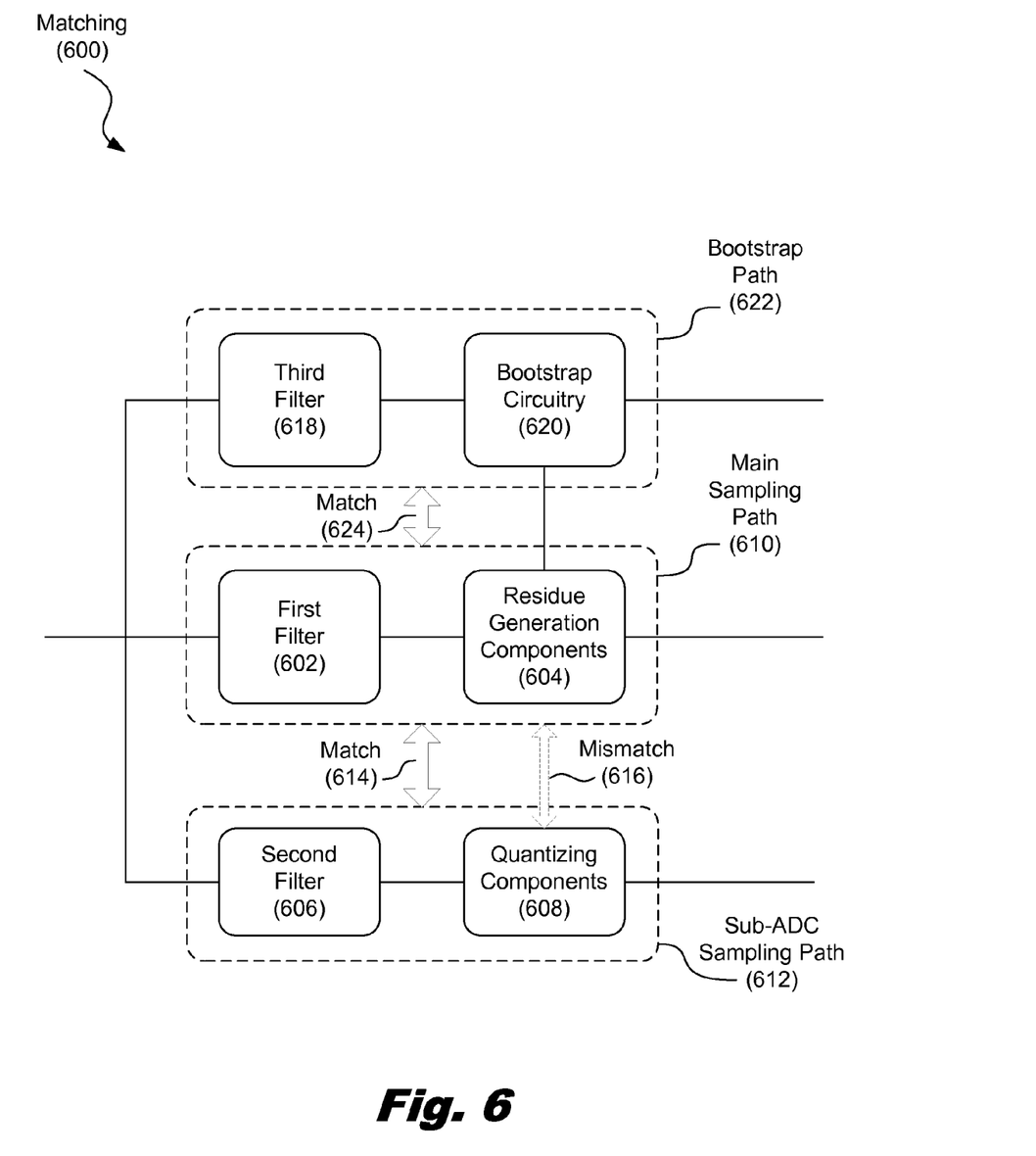
FIG. 6 is a diagram showing illustrative matching of sampling paths, according to one example of principles described herein.

FIG. 6 is a diagram showing illustrative matching (600) of sampling paths. As mentioned above, the path through the residue generation component is matched to the sampling path through the quantization component. The main sampling path includes the first filter (602) and the residue generation components (604) such as a sample-and-hold circuit and a sub-DAC. The sub-ADC sampling path (612) includes the second filter (606) and the quantization components such as a sample-and-hold circuit and sub-ADC.

According to certain illustrative examples, the frequency response of the main sampling path (610) is matched (614) to the frequency response of the sub-ADC sampling path (612). In practice, it is not possible to achieve perfect frequency response matching between two different components. The degree to which the paths (610, 612) are matched is such that the residue signal stays within range of the next stage. Specifically, if the frequency responses were not matched to the point where the difference in signal attenuation between the two paths were such that an error were introduced into the subsequent stage, then the paths (610, 612) would not be appropriately matched. However, if the paths (610, 612) are matched such that the residue signal stays within the designed in digitally correctable range, then they are sufficiently matched.

By matching the paths rather than the components themselves, the sub-ADC within the quantization component does not necessarily have to be matched with the main sampling path. Specifically, differences between the first filter (602) and the second filter (606) can match the overall characteristics of the paths while allowing differences in the components (604, 608) themselves. This allows more flexibility in designing the sub-ADC. Specifically, the sub-ADC may exhibit certain characteristics that also cause a mismatch (616) between the sub-ADC and the main sampling path. However, in some examples, the sub-ADC may also match the main sampling path (610).

In cases where bootstrap circuitry is used, the bootstrap path (622) is also designed to have a frequency response that is matched with the frequency response of the main sampling path (610). In this example, the bootstrap path is shown connected to the sampling circuitry within the main sampling path (610). However, there may be multiple bootstrap signal paths, some of which are connected to sampling circuitry within the sub-ADC sampling path (612). Each of these bootstrap circuits may have one or more filters (618) associated therewith which can be designed to cause a matching frequency response. This allows for flexibility in designing the bootstrap circuit. Specifically, characteristics of the bootstrap circuitry (620) that would cause the frequency response to be mismatched with that of the main sampling path can be offset with an appropriate third filter (618) design.

Figure 7:
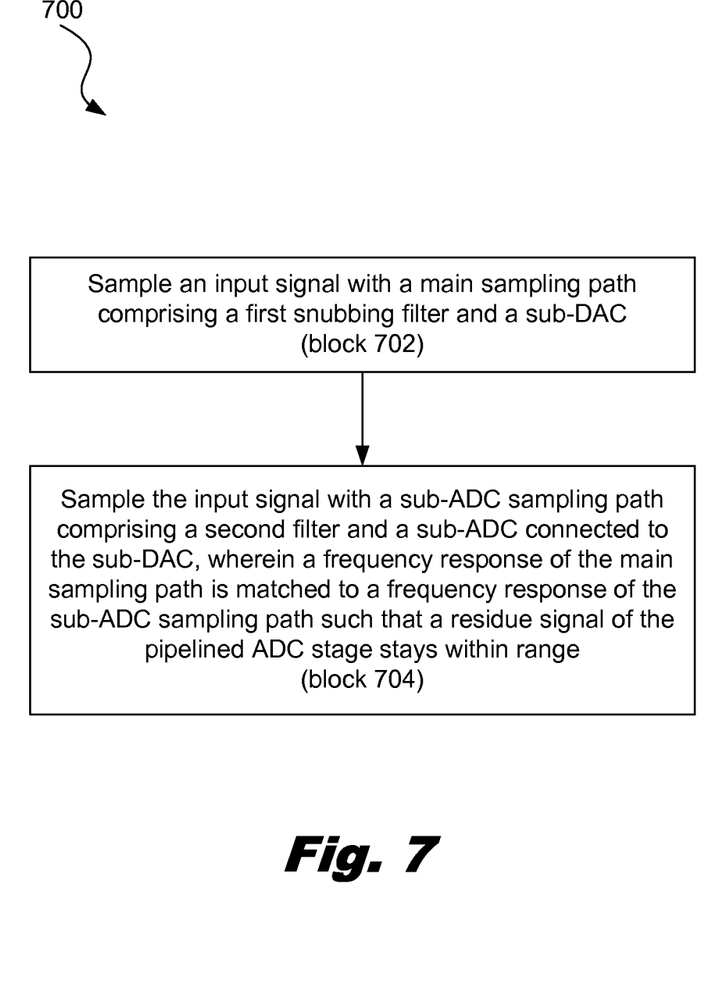
FIG. 7 is a diagram showing an illustrative method for operating a pipelined ADC having filtered, matched sampling paths, according to one example of principles described herein.

FIG. 7 is a diagram showing an illustrative method for operating a pipelined ADC having filtered, matched sampling paths. According to certain illustrative examples, the method includes sampling (block 702) an input signal with a main sampling path comprising a first snubbing filter and a sub-DAC, and sampling (block 704) the input signal with a sub-ADC sampling path comprising a second filter and a sub-ADC connected to the sub-DAC. The frequency response of the main sampling path is matched to a frequency response of the sub-ADC sampling path such that a residue signal of the pipelined ADC stage stays within range.

In conclusion, by matching the combination of the paths with the filters, the sub-ADC may be mismatched with the main sampling path while having the overall paths remain matched. This allows for more freedom in the design of the sub-ADC. For example, it is desirable to have a sub-ADC with a fast conversion time. This is more achievable in certain situations where the sub-ADC does not have to substantially match the main sampling path. Specifically, performance can be increased in some cases by introducing characteristics into the sub-ADC that result in a frequency response mismatch between the sub-ADC and the main sampling path. This mismatch can be accommodated by adjustments in the filters and also with a larger residue signal range for the stage.

The preceding description has been presented only to illustrate and describe examples of the principles described. This description is not intended to be exhaustive or to limit these principles to any precise form disclosed. Many modifications and variations are possible in light of the above teaching.

What is claimed is:

1. A pipelined Analog-to-Digital Converter (ADC) stage comprising:
   a main sampling path comprising a first filter in series with a first sample and hold circuit; and
   a sub-ADC sampling path comprising a second filter in series with a second sample and hold circuit driving a sub-ADC connected to a sub-Digital-to-Analog Converter (DAC);
   wherein a frequency response of said main sampling path is matched to a frequency response of said sub-ADC sampling path such that a residue signal of said pipelined ADC stage stays within range.

2. The pipelined ADC of claim 1, further comprising a signal input that is connected to multiple filters, said filters being connected to said main sampling path, said sub-ADC sampling path, and bootstrap circuitry, said bootstrap circuitry having outputs connected to said sample and hold circuits within said pipelined ADC stage.

3. The pipelined ADC of claim 2, wherein said bootstrap circuitry is shared by said first sample and hold circuit and said second sample and hold circuit.

4. The pipelined ADC of claim 2, wherein said first sample and hold circuit and said second sample and hold circuit utilize different bootstrap circuits.

5. The pipelined ADC of claim 1, wherein a frequency response of said sub-ADC is not matched with a frequency response of said main sampling path.

6. The pipelined ADC of claim 1, wherein said main sampling path is configured to sample an input signal in a time-interleaved manner.

7. The pipelined ADC of claim 3, wherein each sampling circuit of at least one of: said main sampling path and said sub-ADC sampling path uses a different filter.

8. The pipelined ADC of claim 1, wherein said pipelined ADC is a differential pipelined ADC.

9. The pipelined ADC of claim 1, wherein sampling of said main sampling path is performed using capacitors of said MDAC.

10. The pipelined ADC of claim 1, wherein said sampling of said sub-ADC sampling path is performed using capacitors of said sub-ADC.

11. The pipelined ADC of claim 1, wherein said filters are designed to mitigate an impact of charge injections from said sampling paths.

12. The pipelined ADC of claim 1, further comprising, bootstrap circuitry connected a sample-and-hold circuit within one of said sampling paths, said bootstrap circuitry utilizing a filter, said filter causing a path through said bootstrap circuitry to have a frequency response that matches said frequency response of said main sampling path.

13. The pipelined ADC of claim 1, wherein at least one of said filters comprises at least one of: differential components and single-ended components.

14. A method for operating a pipelined Analog-to-Digital Converter (ADC) stage, the method comprising:
   sampling an input signal with a main sampling path comprising a first snubbing filter and a Multiplying-Digital-to-Analog Converter (MDAC); and
   sampling said input signal with a sub-ADC sampling path comprising a second filter and a sub-ADC connected to said MDAC;
   wherein a frequency response of said main sampling path is matched to a frequency response of said sub-ADC sampling path such that a residue signal of said pipelined ADC stage stays within range.

15. The method of claim 14, wherein a frequency response of said sub-ADC is not matched with a frequency response of said main sampling path.

16. The method of claim 14, wherein said main sampling path is configured to sample an input signal in a time-interleaved manner.

17. The method of claim 14, wherein said pipelined ADC is a differential pipelined ADC.

18. The method of claim 14, wherein sampling of said main sampling path is performed using capacitors of said MDAC.

19. The method of claim 14, wherein said sampling of said sub-ADC sampling path is performed using capacitors of said sub-ADC.

20. A pipelined Analog-to-Digital Converter (ADC) comprising a number of stages, a first stage comprising:
   a signal input connected to a main sampling path comprising a first snubbing filter between said signal input and a Multiplying-Digital-to-Analog Converter (MDAC); and a sub-ADC sampling path comprising a second filter between said signal input and a sub ADC connected to said MDAC, said sub-ADC sampling path also connected to said signal input;

wherein a frequency response of said main sampling path is matched to a frequency response of said sub-ADC sampling path such that a residue signal of said pipelined ADC stage stays within range and a frequency response of said sub-ADC is not matched with a frequency response of said main sampling path.

* * * * *